United States Patent
Huang et al.

(10) Patent No.: US 9,209,371 B2
(45) Date of Patent: Dec. 8, 2015

(54) SEMICONDUCTOR CONSTRUCTION, SEMICONDUCTOR UNIT, AND MANUFACTURING METHOD THEREOF

(71) Applicant: Unistars, Hsinchu County (TW)

(72) Inventors: Tien-hao Huang, Zhongli (TW); Shang-Yi Wu, Hsinchu (TW); Yi-chun Wu, Miaoli County (TW)

(73) Assignee: Unistars, Hsinchu County (TW)

( * ) Notice: Subject to any disclaimer, the term of this patent is extended or adjusted under 35 U.S.C. 154(b) by 29 days.

(21) Appl. No.: 13/835,632

(22) Filed: Mar. 15, 2013

(65) Prior Publication Data

US 2014/0151741 A1 Jun. 5, 2014

(30) Foreign Application Priority Data

Nov. 30, 2012 (TW) .............................. 101145196 A

(51) Int. Cl.
*H01L 33/60* (2010.01)
*H01L 33/62* (2010.01)
*H01L 33/48* (2010.01)

(52) U.S. Cl.
CPC .............. *H01L 33/62* (2013.01); *H01L 33/486* (2013.01); *H01L 2224/48091* (2013.01); *H01L 2224/48227* (2013.01); *H01L 2933/0033* (2013.01)

(58) Field of Classification Search
CPC . H01L 23/3677; H01L 33/642; H01L 23/147; H01L 23/49827; H01L 33/641; H01L 25/167; H01L 33/486; H01L 33/60; H01L 33/62; H01L 24/97
See application file for complete search history.

(56) References Cited

U.S. PATENT DOCUMENTS

| | | | |
|---|---|---|---|
| 6,097,089 A * | 8/2000 | Gaku et al. ..................... | 257/712 |
| 2009/0078956 A1* | 3/2009 | Tseng et al. .................... | 257/98 |
| 2009/0166664 A1* | 7/2009 | Park et al. ........................ | 257/99 |
| 2010/0032705 A1* | 2/2010 | Shin et al. ....................... | 257/99 |

* cited by examiner

*Primary Examiner* — David Vu
*Assistant Examiner* — Mouloucoulaye Inoussa
(74) *Attorney, Agent, or Firm* — Alan D. Kamrath; Kamrath IP Lawfirm, P.A.

(57) ABSTRACT

A semiconductor structure and its manufacturing method including multiple steps are provided. First, a patterned circuit board having a substrate and a patterned circuit layer is provided. The substrate includes a first surface, a second surface, at least one connecting channel, and at least one conductive through hole, wherein patterned circuit layer is disposed on the first surface, a second surface, and the inside wall of the conductive through hole. Then, the patterned circuit board is disposed on a carrier, and the patterned circuit layer disposed on one of the first surface and the second surface is touched with the carrier. Then, a filling process is applied. A filling material flows to the conductive through hole via the first surface or the second surface from the connecting channel. Then, a package material is provided to produce a semiconductor structure.

10 Claims, 4 Drawing Sheets

SEMICONDUCTOR CONSTRUCTION, SEMICONDUCTOR UNIT, AND MANUFACTURING METHOD THEREOF

CROSS-REFERENCE TO RELATED APPLICATION

This application claims priority from Taiwan Patent Application No. 101145196, filed on Nov. 30, 2012, the contents of which are hereby incorporated by reference in their entirety for all purposes.

BACKGROUND OF THE INVENTION

1. Field of the Invention

The present invention relates to a semiconductor structure, a semiconductor unit, and a manufacturing method thereof; more particularly, to a semiconductor structure, a semiconductor unit, and a manufacturing method thereof. In the semiconductor structure and a semiconductor unit, the filling material in a connecting channel and the filling material in a through hole are connected to each other.

2. Description of the Prior Art

In recent years, with the rapid improvement in production technology of electronics industry, the circuit boards are designed to carry a variety of fine-sized electronic components to be extensively applied in electronic products of different functions. The circuit board needs to be packaged after the electronic components i.e. chips are mounted, so the chips will not be affected by the environment. Because the current circuit board has through holes within, when the chip packaging process is implemented to a surface of the circuit board, the packaging material may flow from one surface of the circuit board to another surface of the circuit board in the reversed side via the through holes. This contaminates the circuit on another surface and an additional cleaning process would have to be employed for removing the excessive glue. The implementation of the cleaning process, however, would result in the increase in cost as well as overall complexity of the chip packaging process. The chemicals used in such process might also affect the circuit on the circuit board and alter the signal transmission quality of the circuit.

SUMMARY OF THE INVENTION

The present invention provides a manufacturing method of a semiconductor structure that prevents the packaging material flowing from the chip bonding surface to the corresponding surface in reversed side via the through hole when the chip packaging process is implemented, that is, effectively restricting the packaging material within the chip bonding surface.

The present invention provides a semiconductor structure which can keep the cleanness of the circuit on the corresponding surface after the chip packaging process is implemented.

The present invention provides a semiconductor structure which includes a substrate, a patterned circuit layer, at least one chip, a filling material, and a packaging material such as phosphor and glue. The substrate has a first surface and a second surface, with at least one through hole and at least one connecting channel. The patterned circuit layer is disposed on the first surface, the second surface, and all of the through holes, where the patterned circuit layer in the through hole is electrically connected to the patterned circuit layers on the first and second surfaces. The chips are bonded on the substrate and electrically connected to the patterned circuit layer. There are three parts of the filling material, i.e. first part, second part, and third part, where the through holes and connecting channels are filled by first part and third part, respectively. And, the second part connects the first and the third parts. The filling material is an insulating material such as epoxy or silicone glue. The packaging material covers all of the chips and some portion of the substrate.

The present invention further provides a manufacturing method of a semiconductor structure and the manufacturing method includes the following steps. Firstly, a substrate having a first surface in one side, a second surface in reversed side, and at least one connecting channel is provided. After at least one through hole is formed in the substrate, an insulating layer is disposed on the first surface, the second surface, and the inner wall of all through holes. After that, a patterned circuit layer is developed on the insulating layer to form a patterned circuit board. The patterned circuit layer is disposed on the first surface, the second surface, and in each of the through holes. The patterned circuit layer in the through hole is electrically connected to the patterned circuit layers on the first and second surfaces. Next, the patterned circuit layer is disposed on a carrier so that the patterned circuit layer on the first or the second surface touches the carrier closely. A filling material is then dispensed to the connecting channel, where the filling material flows to the through hole from the connecting channel via the first or second surface so as to make the filling material fill up the through hole. Then, the filling material is cured. The filling material is an insulating material. After above mentioned processes, at least one chip is provided and each of the chips is electrically connected to the corresponding patterned circuit layer. A packaging material such as phosphor and glue is dispensed to cover all of the chips and some portions of the substrate to form a semiconductor structure.

According to the foregoing, the present invention is about implementing a filling process to the connecting channel or the through hole after disposing the patterned circuit board on a carrier so that the patterned circuit layer of the first or second surface touches the carrier closely. Therefore a filling material flows to the through hole from the connecting channel via the first or second surface, so as to complete the filling process. As a result, during the chip packaging process, the packaging material will be restricted within the chip bonding surface and will not flow from the chip bonding surface to the surface in reversed side via the through hole. That is, the present invention may effectively restrict the flow of packaging material in order to maintain the cleanness and quality of the circuit on the surface of reversed side after chip packaging process is completed.

It is noted that due to the poor thermal conductivity of the insulating layer, the insulating layer on the first and the second surfaces may be patterned, such that the chips may be placed at parts with no insulating layer and the waste heat produced by the chips could be easily excluded from the semiconductor structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
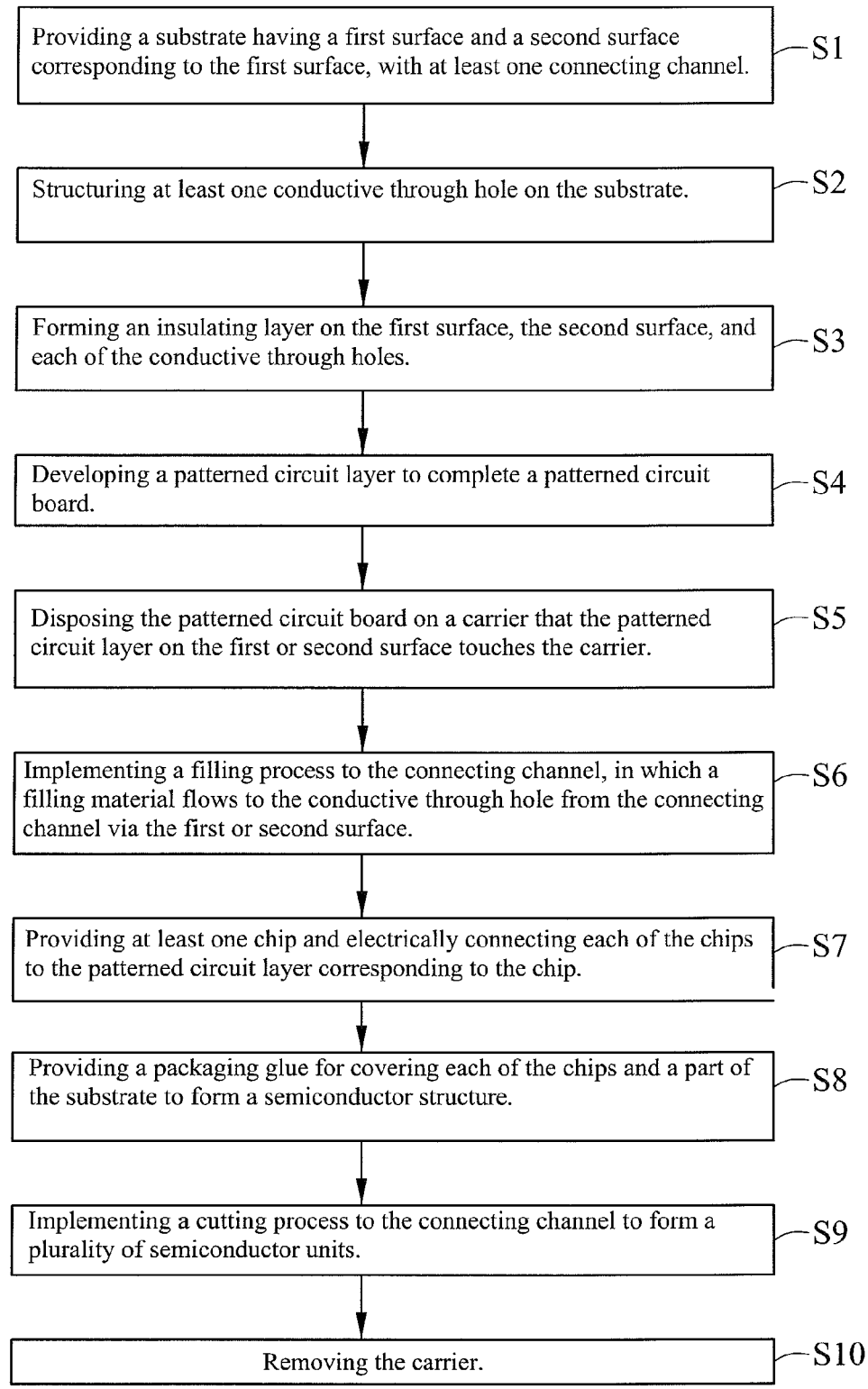
FIG. 1 is a flowchart illustrating the fabrication of a semiconductor structure according to a preferred embodiment of the present invention.

FIG. 1 is a flowchart illustrating the fabrication of a semiconductor structure according to a preferred embodiment of the present invention. Referring to FIG. 1, the manufacturing method of a semiconductor includes the following steps. In step S1, a substrate having a first surface in one side, a second surface in the reversed side, and at least one connecting channel is provided. In step S2, at least one through hole is formed in the substrate. In step S3, an insulating layer is formed on the first surface, the second surface, and the inner wall of all through hole.

Step S4 is executed after the implementation of step S3. In step S4, a patterned circuit board is completed by the formation of a patterned circuit layer on the insulating layer. In step S5, the patterned circuit board is disposed on a carrier so that the patterned circuit layer on the first or second surface touches the carrier closely. In step S6, a filling material is dispensed to the connecting channel so that the filling material flows to the through hole from the connecting channel via the first or second surface. In step 7, the filling material is baked and cured, and the carrier is removed afterwards.

Step S8 is executed after the implementation of step S7. In step S8, at least one chip is provided and each of the chips is electrically connected to the corresponding patterned circuit layer. In step S9, a packaging material is applied to cover each of the chips and a part of the substrate to form a semiconductor structure. Naturally, the completion of the semiconductor structure is followed by step S10, in which a cutting process is implemented to the connecting channel to form a plurality of semiconductor units. In the following context, the abovementioned manufacturing method of a semiconductor will be illustrated by detailed cross-sectional views.

Figure 2A:
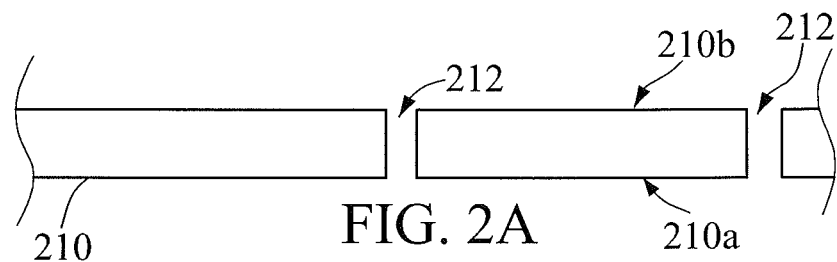
FIGS. 2A to 2H are cross-sectional views of the manufacturing method of a semiconductor structure in FIG. 1.
Figure 2B:
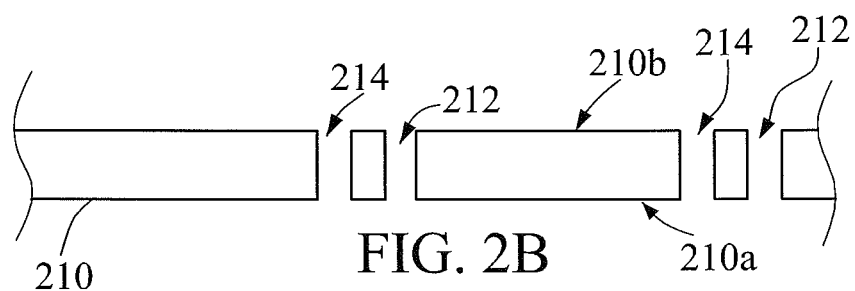
Figure 2C:
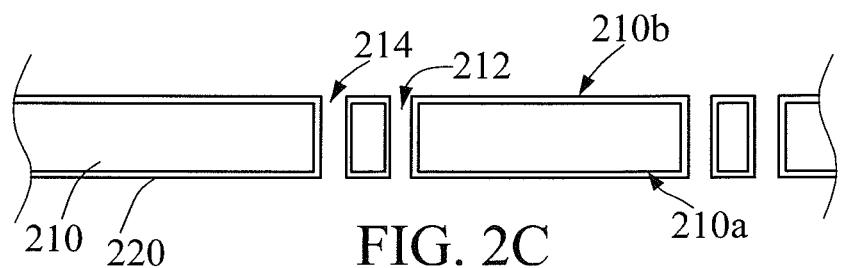

FIGS. 2A to 2H are cross-sectional views of the manufacturing method of a semiconductor structure in FIG. 1. The manufacturing method of a semiconductor structure is stated as follows. As shown in FIG. 2A, a substrate 210 having a first surface 210a in one side, a second surface 210b in the reversed side, and at least one connecting channel 212 is provided. The substrate 210 is made of metal or other suitable materials. The connecting channel 212 is a hollow portion of the substrate 210, for example: a dicing channel. Next, at least one through hole 214 is formed on the substrate 210 as shown in FIG. 2B. In this embodiment, the through hole 214 is adjacent to the connecting channel 212 and structured by, for example, mechanical drilling, laser ablation, or other suitable methods. After forming at least one through hole 214 on the substrate 210, an insulating layer 220 is formed on the first surface 210a, the second surface 210b, the inner walls of all through hole 214, and the inner walls of all connecting channel 212, as shown in FIG. 2C. The insulating layer 220 may be formed by print coating, chemical vapor deposition, or other suitable methods; its material may be resin, other organic material, or suitable insulating materials such as silicon dioxide, silicon nitride, and aluminum oxide. Besides, the insulating layer 220 on the first surface 210a and the second surface 210b may be fabricated to a pattered insulating layer 220, thus a part of the substrate 210 will be exposed and later used to place the chips for heat dissipation.

Figure 2D:
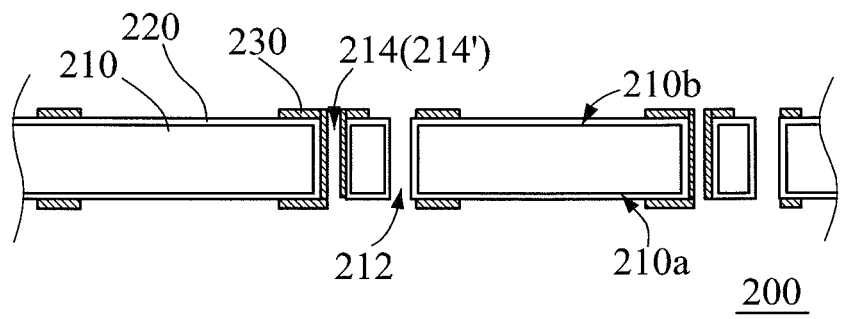
Figure 2E:
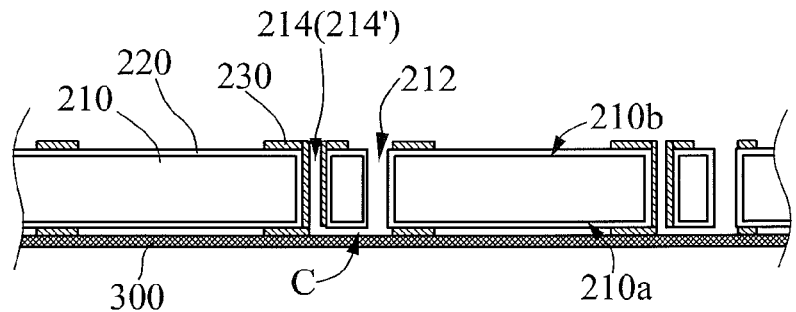

Consequently, as shown in FIG. 2D, a patterned circuit board 200 is completed by developing a patterned circuit layer 230 on the insulating layer 220 with methods such as plating, photolithography, and etching. In this embodiment, the patterned circuit layer 230 is located on the first surface 210a, the second surface 210b, and in the inner walls of all through holes 214. The patterned circuit layer 230 in the through holes 214 is electrically connected to the patterned circuit layer 230 on the first surface 210a and the patterned circuit layer 230 on the second surface 210b. That is, the through hole 214 is a conductive channel 214'. After that, as shown in FIG. 2E, the patterned circuit board 200 is disposed on a carrier 300 so that the patterned circuit layer 230 on the first surface 210a or the second surface 210b touches the carrier 300 closely. It is noted that the patterned circuit layer 230 on the second surface 210b that touches the carrier 300 in FIG. 2E is an example and the carrier 300 may be but not limited to a tape or any carriers with an even surface.

Figure 2F:
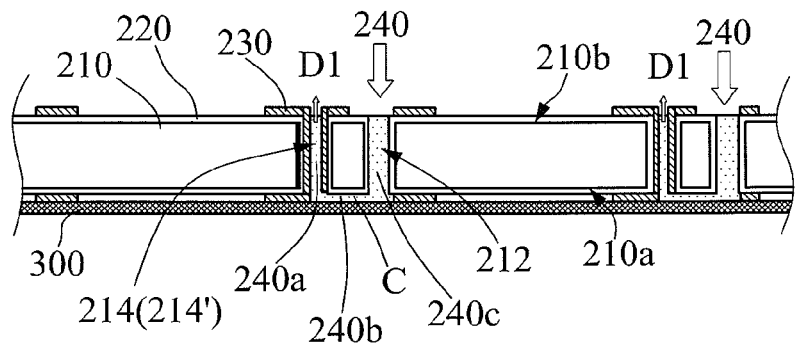

As shown in FIG. 2F, a filling process is implemented to the connecting channel 212 that a filling material 240 flows to the through holes 214 from the connecting channel 212 via the first surface 210a or the second surface 210b. The filling material 240 possesses a proper flow property. Its viscosity coefficient is, for example, between 400 cps and 4000 cps, preferably between 500 cps and 2000 cps. The filling material 240 that flows to the through holes 214 via the first surface 210a in FIG. 2F is served as an example, in which the filling material 240 may be baked and cured after the filling process and the filling material 240 may be an insulating material. In this embodiment, the cured filling material 240 may be defined as a first part 240a, a second part 240b, and a third part 240c, in which the first part 240a fills the through holes 214, the third part 240c fills the connecting channel 212, and the second part 240b connects the first part 240a and the third part 240c.

In detail, when a part of the patterned circuit layer 230 between the through hole 214 and the connecting channel 212 is disposed on the first surface 210a and the patterned circuit board is disposed on the carrier 300 that the first surface 210a faces towards the carrier 300, the thickness of the patterned circuit layer 230 is the distance between the carrier 300 and the first surface 210a, and a flow channel C exists between the carrier 300 and the first surface 210a. The filling material 240 flows between the connecting channel 212 and the through hole 214 via the flow channel C and the filling material 240 in the flow channel C becomes the second part 240b after curing. The surface of the second part 240b is higher than the first surface 210a, and is lower than or equal to the patterned circuit layer 230 corresponding to the first surface 210a. It is worth mentioning that during the process of dispensing the filling material 240 into the connecting channel 212 in this embodiment, the siphon principle is used for the filling of the through hole 214 that connects to the connecting channel 212, and the filling material 240 fills the through hole 214 in a direction D1 away from the carrier 300. Moreover, in this embodiment, the filling material 240 is baked and cured after the filling process and the carrier 300 is removed afterwards. The chip packaging process will continue after the removal of carrier 300. A detailed description of the chip packaging process will be illustrated as follows.

Figure 2G:
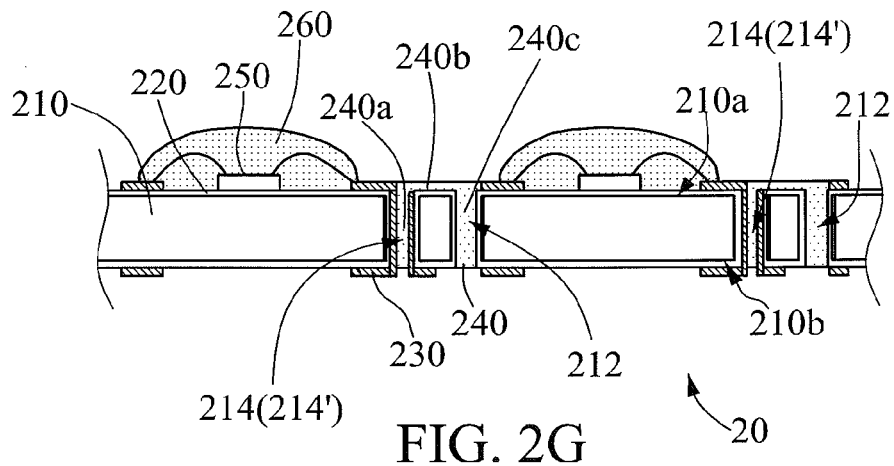
Figure 2H:
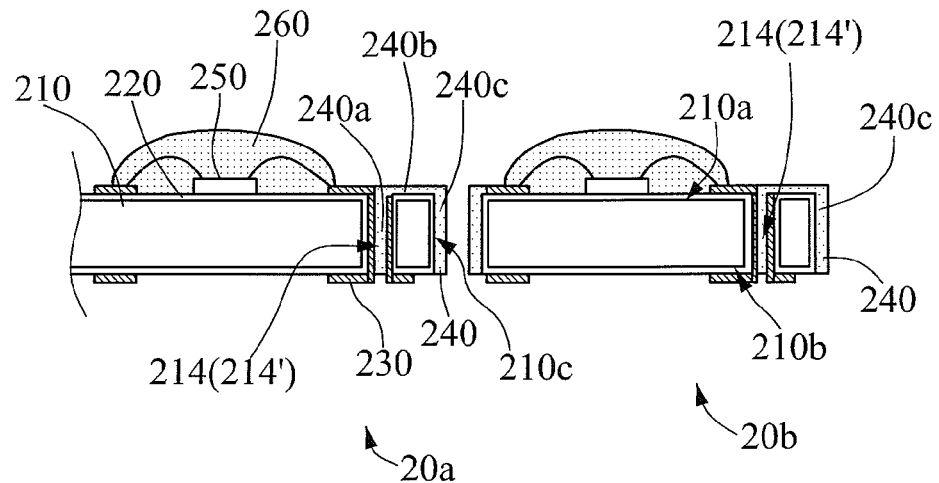

As shown in FIG. 2G, at least one chip 250 (two chips in this embodiment) is disposed on the first surface 210a and each of the chips 250 is electrically connected to the corresponding patterned circuit layer 230. A packaging material 260 is provided for covering each of the chips 250 and a portion of the substrate 210 to form a semiconductor structure 20. In this embodiment, each of the chips 250 is electrically connected to the corresponding patterned circuit layer 230, the chip 250 and the patterned circuit layer 230 are connected to each other with for example, the wire bonding method, and the packaging material 260 may be a suitable material such as epoxy or silicone. Naturally, after the fabrication of the semiconductor structure 20 is completed, a cutting process may be implemented to the connecting channel 212 to form a plurality of semiconductor units, as shown in FIG. 2H. Accordingly, two sides of the foregoing connecting channel 212 form a first semiconductor unit 20a and a second semiconductor unit 20b, respectively. The packaging material 260 is transparent glue and the chip 250 is a light-emitted diode, for example.

According to the above description, after the implementation of the cutting process, a part of the cured filling material 240 exists on the side of the substrate 210c in each semiconductor unit. Such filling material 240 is the above-mentioned third part 240c. Moreover, in the above embodiments, the filling process in the connecting channel 212 is an example; in other embodiments, the filling process may be implemented in a specific or a suitable through hole 214 in coordination with manufacturing methods or other special needs, such that the filling material 240 flows from one through hole 214 to another or to the connecting channel 212, and then to another through hole 214. Any filling process implemented in the connecting channel 212 or the through hole 214 by the structure of connected connecting channel 212 and the through hole 214 is included in the scope of the present invention; no limitation regarding this matter is imposed herein.

In addition, in the above embodiment, the carrier 300 is removed after the filling material 240 is cured. In other embodiment, the carrier may be removed after the chip packaging and cutting processes are completed.

Figure 3:
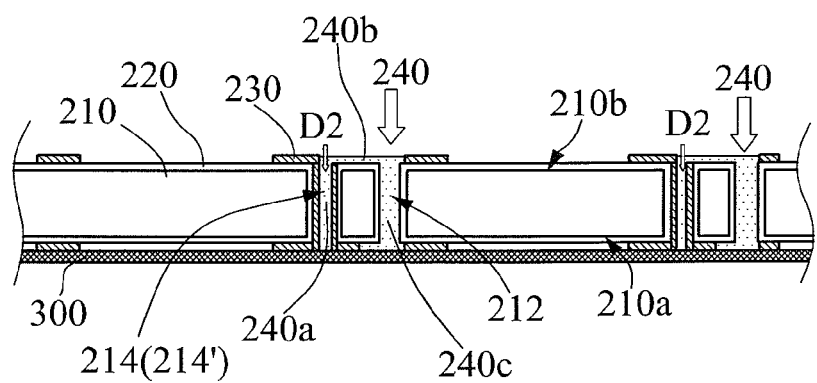
FIG. 3 is a schematic view of a process of dispensing a filling material to a connecting channel and a through hole according to another preferred embodiment of the present invention.

In the present invention, in addition to the filling process that the filling material 240 fills the connecting channel 212 and the through hole 214 as illustrated in FIG. 2F, another filling process in the connecting channel 212 and the through hole 214 may be used. Referring to FIG. 3, it is a schematic view of a filling process in the connecting channel 212 and the through hole 214 according to another embodiment of the present invention. In this embodiment, a portion of the patterned circuit layer 230 between the through hole 214 and the connecting channel 212 is disposed only on the first surface 210a and the patterned circuit board 200 may be disposed on the carrier 300 in the manner that the first surface 210a faces towards the carrier 300, so that the part of the patterned circuit layer 230 on the first surface 210a touches the carrier 300 closely. Therefore after filling up in the connecting channel 212 and the space between the connecting channel 212 and the carrier 300, the filling material 240 overflows from the connecting channel 212 to the through hole 214 via the second surface 210b. The second part then forms on the second surface 210b.

In detail, because the patterned circuit layer 230 is formed between the second surface 210b between the through hole 214 and the connecting channel 212 in FIG. 2F, a flow channel C exists between the carrier 300 and the portion of the first surface 210a between the through hole 214 and the connecting channel 212. On the contrary, in this embodiment, because the patterned circuit layer 230 exists on the portion of the first surface 210a between the through hole 214 and the connecting channel 212, the patterned circuit layer 230 on the portion of the first surface 210a between the through hole 214 and the connecting channel 212 will prevent the filling material 240 from flowing in the space between the patterned circuit board 200 and the carrier 300. Thus in this embodiment, after filling up in the connecting channel 212 and the space between the connecting channel 212 and the carrier 300, the filling material 240 overflows from the connecting channel 212 to the through hole 214 via the second surface 210b to complete the filling process of the through hole 214.

In this filling process, the filling material 240 fills the through hole 214 in a direction D2 towards the carrier 300.

According to the above, in the filling process of the embodiment, since a part of the patterned circuit layer 230 is disposed on the portion of the first surface 210a between the through hole 214 and the connecting channel 212, the second part 240b is formed on the second surface 210b. On the contrary, if a part of the patterned circuit layer 230 is disposed only on the portion of the second surface 210b between the through hole 214 and the connecting channel 212, the second part 240b will form on the first surface 210a. Correspondingly, the surface of the second part 240b will be higher than the first surface 210a and lower than or equal to the patterned circuit layer 230 corresponding to the first surface 210a.

In the above embodiments, the patterned circuit board 200 is disposed on the carrier 300 in the manner that the first surface 210a faces towards the carrier 300. A person skilled in the art may also dispose the patterned circuit board 200 in the manner that the second surface 210b faces towards the carrier 300.

In summary, in the present invention, after the patterned circuit board is disposed on a carrier that the patterned circuit layer on the first or second surface touches the carrier, the filling process is implemented in the connecting channel or the through hole, in which the filling material flows to the connecting channel or the through hole from the connecting channel or the through hole via the first or second surface, so as to complete the filling process to the connecting channel and the through hole.

That is, the present invention may effectively restrict the flow of the packaging material and thus maintain the cleanness and the quality of the circuit.

The present invention resolves the disadvantages found in prior art. During the chip packaging process, an additional cleaning process needs to be employed for removing the excessive packaging material on the surface in the reversed side after the packaging material overflows. Because the cleaning process increases the cost as well as the complexity of overall packaging process, the present invention effectively decreases cost and simplifies the packaging process. Furthermore, since a metal substrate with the hollow dicing channel is used in the present invention, during the cutting process the cutting tool is cutting the hollow dicing channel, thus reducing the attrition of the cutting tool and the packaging cost.

Moreover, other than the light-emitted diode, the above-mentioned chips may be semiconductor chips in other forms such as logic IC, memory IC, analog IC, or CMOS sensor component.

Those skilled in the art will readily observe that numerous modifications and alterations of the device and method may be made while retaining the teachings of the invention.

What is claimed is:
1. A semiconductor structure comprising:
a substrate having a first surface, a second surface, at least one through hole, and at least one connecting channel;
a patterned circuit layer disposed on the first surface, the second surface, and in each of the at least one through hole, wherein the patterned circuit layer in the at least one through hole is electrically connected to the patterned circuit layer on the first and second surfaces;
at least one chip bonded on the first surface and electrically connected to the patterned circuit layer;
a filling material having a first part, a second part, and a third part, wherein the first part fills the at least one through hole, the third part fills all of the at least one connecting channel, and the second part is connected between the first part and third part; and a packaging material covering each of the at least one chip and a part of the substrate, with the packaging material not connected with the filling material;

wherein a surface of the second part of the filling material is higher than a top of the first surface and is lower than or equal to a top of the patterned circuit layer corresponding to the first surface.

2. The semiconductor structure as in claim 1, wherein the substrate is a metal substrate.

3. The semiconductor structure as in claim 2, further comprising an insulating layer wherein the insulating layer is disposed on the first surface, the second surface, and an inner wall of each through hole, and the patterned circuit layer is disposed on the insulating layer.

4. The semiconductor structure as in claim 1, wherein the chip is a light-emitted diode (LED) and the packaging material is a transparent glue.

5. The semiconductor structure as in claim 1, wherein the at least one through hole is adjacent to the at least one connecting channel, the second part is located on a portion of the first surface between the at least one through hole and the at least one connecting channel when a part of the patterned circuit layer is disposed on a portion of the second surface between the at least one through hole and the at least one connecting channel.

6. A semiconductor unit comprising:
a substrate having a first surface, a second surface, and at least one through hole;
a patterned circuit layer disposed on the first surface, the second surface, and in all of the at least one through hole, wherein the patterned circuit layer in the at least one through hole is electrically connected to the patterned circuit layer on the first surface and the patterned circuit layer on the second surface;
at least one chip disposed on the first surface and electrically connected to the patterned circuit layer;
a filling material having a first part, a second part, and a third part, wherein the first part fills the at least one through hole, the third part is located on the side of the substrate adjacent to the at least one through hole, and the second part is connected between the first part and the third part; and
a packaging material covering each of the at least one chip and a part of the substrate, and the packaging material not connected with the filling material;
wherein a surface of the second part of filling material is higher than a top of the first surface and is lower than or equal to a top of the patterned circuit layer corresponding to the first surface.

7. The semiconductor unit as in claim 6, wherein the substrate is a metal substrate.

8. The semiconductor unit as in claim 7, wherein an insulating layer is further disposed on the first surface, the second surface, and an inner wall of each through hole, and the patterned circuit layer is disposed on the insulating layer.

9. The semiconductor unit as in claim 6, wherein the packaging material is a transparent glue and the chip is a light-emitted diode.

10. The semiconductor unit as in claim 6, wherein when a part of the patterned circuit layer is disposed on a portion of the first surface between the through hole and the side of the substrate, the second part is located on a portion of the second surface between the through hole and the side of the substrate; when a part of the patterned circuit layer is disposed on the portion of the second surface between the through hole and the side of the substrate, the second part is located on the portion of the first surface between the through hole and the side of the substrate.

* * * * *